US007268671B2

(12) United States Patent
McDaniel et al.

(10) Patent No.: US 7,268,671 B2
(45) Date of Patent: Sep. 11, 2007

(54) SHAPED MODULATION AUDIBLE ALARM

(75) Inventors: Michael S. McDaniel, Peoria, IL (US); David C. Copley, Peoria, IL (US); Daniel E. Zimmermann, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 251 days.

(21) Appl. No.: 10/873,875

(22) Filed: Jun. 22, 2004

(65) Prior Publication Data

US 2005/0280513 A1 Dec. 22, 2005

(51) Int. Cl.
*G08B 3/10* (2006.01)
*H03G 3/20* (2006.01)

(52) U.S. Cl. .................. 340/384.3; 340/435; 340/460; 381/57; 381/107

(58) Field of Classification Search .. 340/384.3–384.4, 340/384.7–384.72; 381/57, 107
See application file for complete search history.

(56) References Cited

U.S. PATENT DOCUMENTS

| | | | | |
|---|---|---|---|---|
| 3,579,233 | A * | 5/1971 | Raschke | 340/384.72 |
| 3,587,094 | A * | 6/1971 | Scott | 340/384.72 |
| 3,943,507 | A | 3/1976 | Neal et al. | |
| 3,975,939 | A * | 8/1976 | McLean | 73/1.86 |
| 4,267,551 | A * | 5/1981 | Dankman et al. | 340/384.3 |
| 4,437,088 | A * | 3/1984 | Ferguson | 340/384.3 |
| 4,603,317 | A | 7/1986 | Gailbreath et al. | |
| 4,644,327 | A | 2/1987 | Patterson | |
| 4,768,022 | A | 8/1988 | Patterson | |
| 5,596,311 | A | 1/1997 | Bess et al. | |
| 6,360,187 | B1 * | 3/2002 | Hermann | 702/191 |
| 6,404,338 | B1 * | 6/2002 | Koslar | 340/571 |

OTHER PUBLICATIONS

SAE J994, Surface Vehicle Standard, Issued Jul. 1967 (Revised Aug. 1993).
CAA Paper 82017, Guidelines for Auditory Warning Systems on Civil Aircraft, Roy D. Patterson, Nov. 1982 (Reprinted Aug. 1985).

* cited by examiner

*Primary Examiner*—Jeffery Hofsass
*Assistant Examiner*—Anne V. Lai
(74) *Attorney, Agent, or Firm*—Steve D. Lundquist

(57) ABSTRACT

A method and apparatus for providing an audible alarm signal. The method and apparatus includes creating a rectangular pulse signal having a desired period and a desired first amplitude, adding a shaped modulation component to the rectangular pulse signal from the desired first amplitude to a desired second amplitude to create a modulating waveform, creating a carrier signal, and combining the carrier signal and the modulating waveform to create the audible alarm signal.

14 Claims, 4 Drawing Sheets

SHAPED MODULATION AUDIBLE ALARM

TECHNICAL FIELD

This invention relates generally to a method and apparatus for creating an audible alarm and, more particularly, to a method and apparatus for creating a shaped modulation audible alarm.

BACKGROUND

Audible alarms of various types are used for a wide variety of purposes. For example, it is common practice to employ backup alarms on commercial vehicles and mobile work machines to notify those in the vicinity that the vehicle or machine is moving and may be moving toward them. Typical alarms of this type may use a repeating audible signal, such as a beeping sound.

In crowded or congested areas, repeated use of audible alarms may become a source of irritation to those not close enough in proximity to be intended recipients of the alarm signals. The harshness of the alarm sound, although necessary in many environments, becomes objectionable beyond the immediate work area.

One attempt to minimize this source of irritation has been to use self-adjusting alarms; that is, alarms which monitor ambient sound and vary the amplitude of the alarm signal in response. Although the levels of the alarms may be reduced in lower noise areas, thus reducing perceived harshness to persons in the area, the varying amplitudes of the alarm signals tend to confuse those in the immediate work area. For example, a person may be near a moving vehicle or machine yet believe that the vehicle or machine is further away due to a reduced amplitude alarm signal.

In addition to the above issues, many work areas require multiple alarms for a multitude of vehicles and machines. Persons within these crowded work areas may, over time, begin to disregard the sound of an audible alarm since it is difficult to differentiate between several alarms repeatedly going off throughout the work site.

The present invention is directed to overcoming one or more of the problems as set forth above.

SUMMARY OF THE INVENTION

In one aspect of the present invention a method for providing an audible alarm signal is disclosed. The method includes the steps of creating a rectangular pulse signal having a desired period and a desired first amplitude, adding a shaped modulation component to the rectangular pulse signal from the desired first amplitude to a desired second amplitude to create a modulating waveform, creating a carrier signal, and combining the carrier signal and the modulating waveform to create the audible alarm signal.

In another aspect of the present invention an apparatus for providing an audible alarm signal is disclosed. The apparatus includes a controller for creating an essentially rectangular pulse signal having a desired first amplitude, and for creating a carrier signal, a shape generator for adding a shaped modulation component to the pulse signal from the desired first amplitude to a desired second amplitude to create a modulating waveform, and a multiplier for combining the carrier signal and the modulating waveform to create the audible alarm signal.

In yet another aspect of the present invention an audible alarm signal is disclosed. The alarm signal includes an essentially rectangular pulse signal having a desired first amplitude, a shaped modulation component added to the pulse signal from the desired first amplitude to a desired second amplitude to create a modulating waveform, a carrier signal, and an audible alarm signal created from a combination of the carrier signal and the modulating waveform.

DETAILED DESCRIPTION

Figure 1:
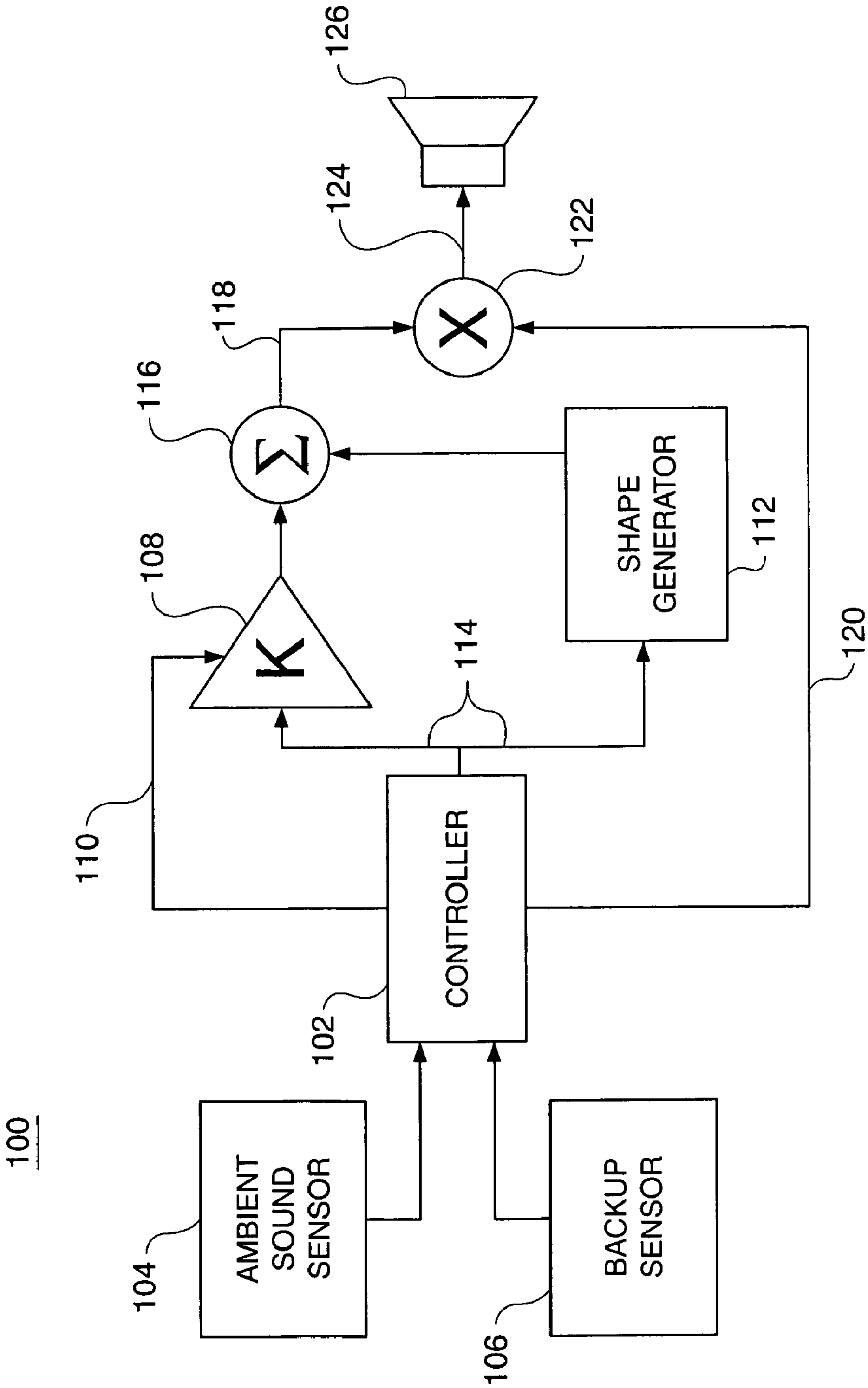
FIG. 1 is a block diagram illustrating an embodiment of the present invention.

Referring to the drawings and the appended claims, a method and apparatus 100 is shown for providing an audible alarm signal 416. The alarm signal may be suited for use in applications in which it is desired to provide notice of a situation. For example, an audible alarm signal may be used to provide notice to persons at a work site that a mobile machine or vehicle is moving. A common application involves the use of audible alarm signals as backup alarms for vehicles and mobile work machines. However, other applications may include security and intrusion systems for facilities, vehicles, and the like, and other applications in which it is desired to provide an alarm for a situation.

Referring to FIG. 1, a block diagram depicting an embodiment of the present invention is shown. It is noted that the embodiment of FIG. 1 is but one configuration that may be used in the present invention. Other variations may be employed without deviating from the spirit and scope of the invention.

Figure 4A:
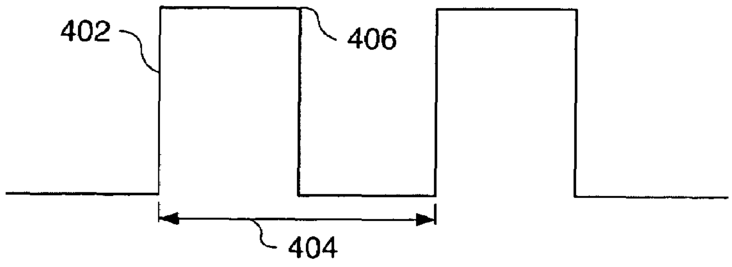
FIGS. 4*a*-4*d* are diagrams illustrating various waveform signals used in the present invention.
Figure 4B:
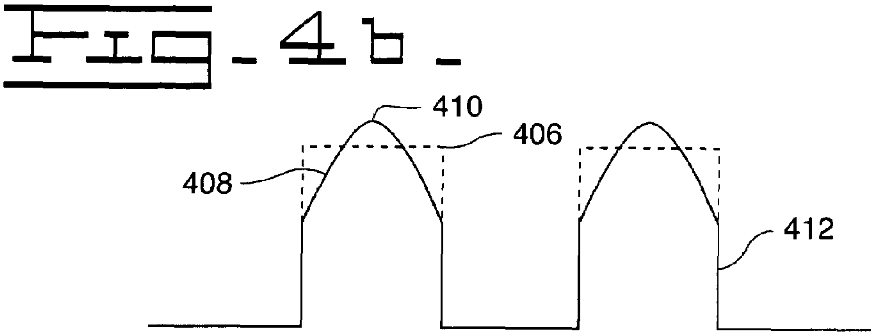
Figure 4C:
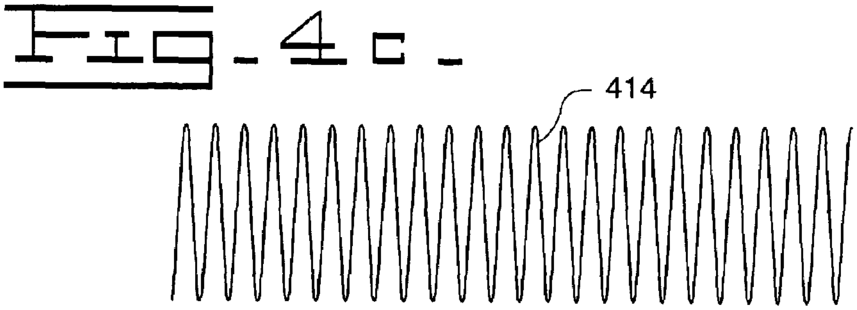

A controller 102 may be used to perform a variety of functions. For example, the controller 102 may create an essentially rectangular pulse signal 402, as shown in FIG. 4*a*. The pulse signal 402 may then be delivered to other components, such as a shape generator 112 and a gain control amplifier 108, via a pulse signal line 114. The controller 102 may perform additional functions, such as creating a carrier signal 414, as depicted in FIG. 4*c*.

The pulse signal 402, as shown in FIG. 4*a*, has a period 404 and a first amplitude 406. For example, the pulse may have a period of about 1 Hertz and an amplitude of about 95 to 100 decibels. Other values for the period and amplitude may be used as well.

The carrier signal 414 typically is of a higher frequency than the pulse signal, for example about 1200 to 1250 Hertz.

The shape generator 112 may add a shaped modulation component 408 to the pulse signal 402 from the first amplitude 406 to a second amplitude 410 to create a modulating waveform 412. As FIG. 4*b* shows, the shaped modulation component 408 may be a sinusoidal component, for example gradually increasing to a maximum value and then gradually decreasing, thus simulating one half of a sinusoid. However, the shaped -modulation component may be configured as different shapes as well, for example, an inverse one half sinusoid, a full sinusoid, a step function signal, a sawtooth signal, and the like.

The second amplitude 410 may be greater in magnitude than the first amplitude 406, for example 10 decibels greater. Alternatively, the second amplitude 410 may be lower in magnitude than the first amplitude 406.

The gain control amplifier 108 receives the pulse signal 402 by way of pulse signal line 114 and may control the amplitude of the pulse signal 402. For example, it may be desired to vary the amplitude of the pulse signal 402 to maintain the signal level a desired amount above an ambient sound level, such as 5 decibels above ambient. Advantages of varying the pulse signal 402 in this manner are described in detail below.

The gain control amplifier 108 outputs the amplitude-varied pulse signal 402 to a summing junction 116 to add the pulse signal 402 and the shaped modulation component 408 together, as shown in FIG. 4*b*. The resultant signal is the modulating waveform 412.

Figure 2:
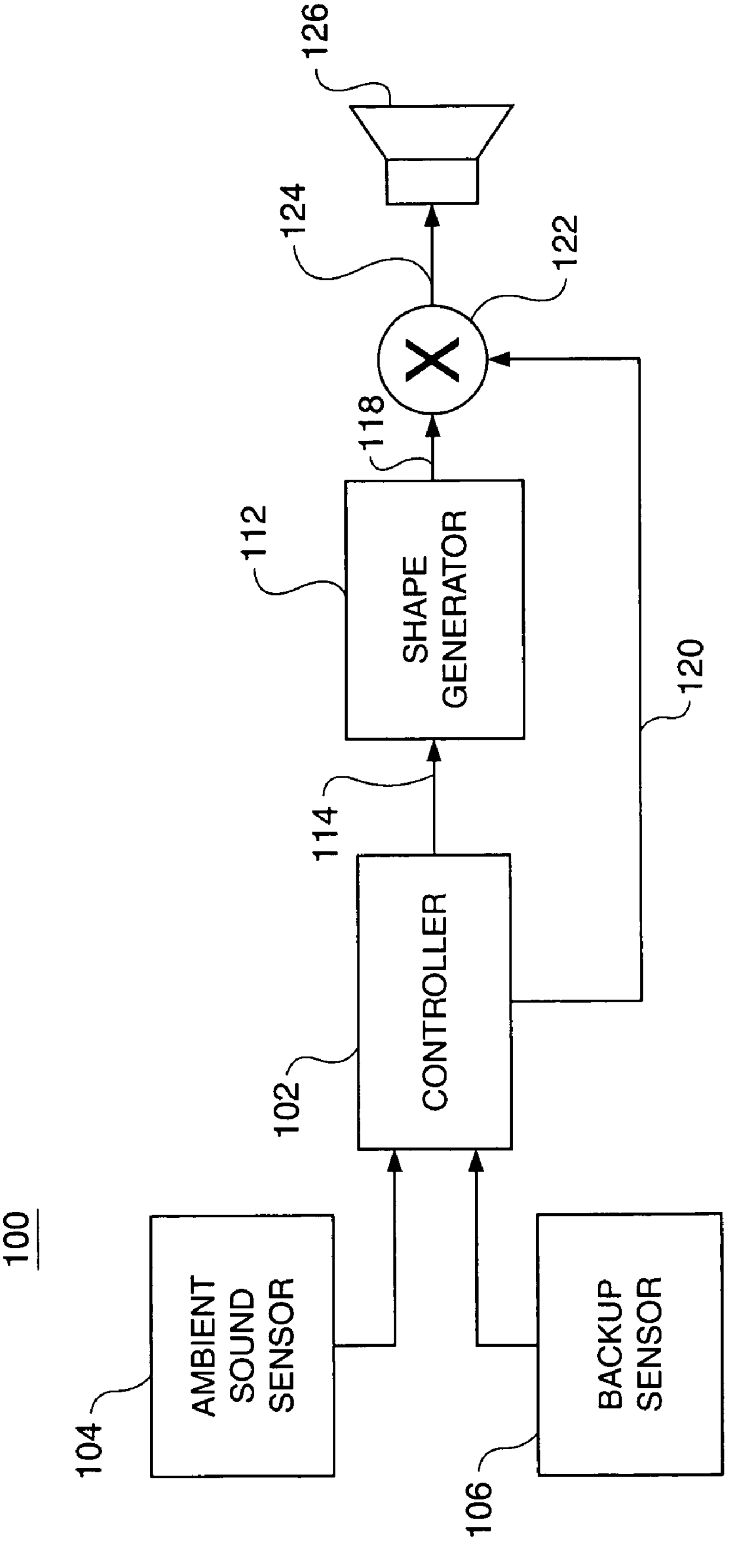
FIG. 2 is a block diagram illustrating another embodiment of the present invention.

In an alternate embodiment, shown in FIG. 2, a gain control amplifier and summing junction are not used. In this embodiment, the shape generator 112 receives the pulse signal 402 at fixed gain and adds the shaped modulation component 408 to create the modulating waveform 412.

Figure 4D:
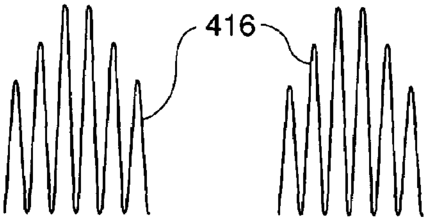

Referring back to FIG. 1, from the summing junction 116 the modulating waveform 412 is carried by way of modulating waveform line 118 to a multiplier 122. The multiplier 122 also receives the carrier signal 414 from the controller 102 by way of a carrier signal line 120. The carrier signal 414 and the modulating waveform 412 are combined by the multiplier 122 to create an audible alarm signal 416. FIG. 4*d* illustrates an exemplary audible alarm signal waveform. The audible alarm signal 416 may then generate an audible alarm through a speaker 126.

In certain applications, such as for backup alarm purposes, a backup sensor 106 may be used to determine a condition of a vehicle or mobile machine backing up, thus providing notice that a backup alarm needs actuation. The backup sensor 106 may be of a type well known in the art, such as a sensor configured to sense a transmission being in a reverse gear, movement in a reverse direction, and the like.

An ambient sound sensor 104 may be used to sense a level of ambient sound in the surrounding environment. The ambient sound sensor 104 may be a microphone or a speaker being used as a microphone which picks up sounds and transmits the sounds to the controller 102 for processing and determination of sound levels.

As noted above, it may be desired to maintain the amplitude of the pulse signal and thus the amplitude of the resultant audible alarm signal, a desired level above the ambient sound level of the surrounding environment. For example, the audible alarm signal may be 5 decibels above ambient sound levels. The result is that, as distance from the alarm signal source to a person hearing the alarm increases, the effect of the alarm signal changes due to the shaped modulation component 408. At close ranges, the signal is perceived to be more like that of a carrier signal combined with a pulse signal 402, since the pulse signal portion of the modulating waveform 412 is above the ambient sound floor. This has the effect of creating a somewhat harsh sounding alarm, thus placing more urgency in the effect of the alarm as the distance between alarm source and intended target decreases. However, at greater distances, the pulse signal portion of the modulating waveform drops into the ambient sound floor, and the intended listener only hears the shaped modulation component portion. The shaped modulation component 408, by design, offers a less harsh sound to the perceiving ear. As a result, as distance between the alarm source and the intended listener increases, the perception of urgency in the alarm decreases. One of the benefits is that the alarm signal has an urgent quality only in the vicinity of the alarm, and the sense or urgency, i.e., the harshness, of the signal, decreases away from the source. Thus, the alarm is more noticeable at close ranges when needed, but is not objectionable at greater distances.

INDUSTRIAL APPLICABILITY

Figure 3:
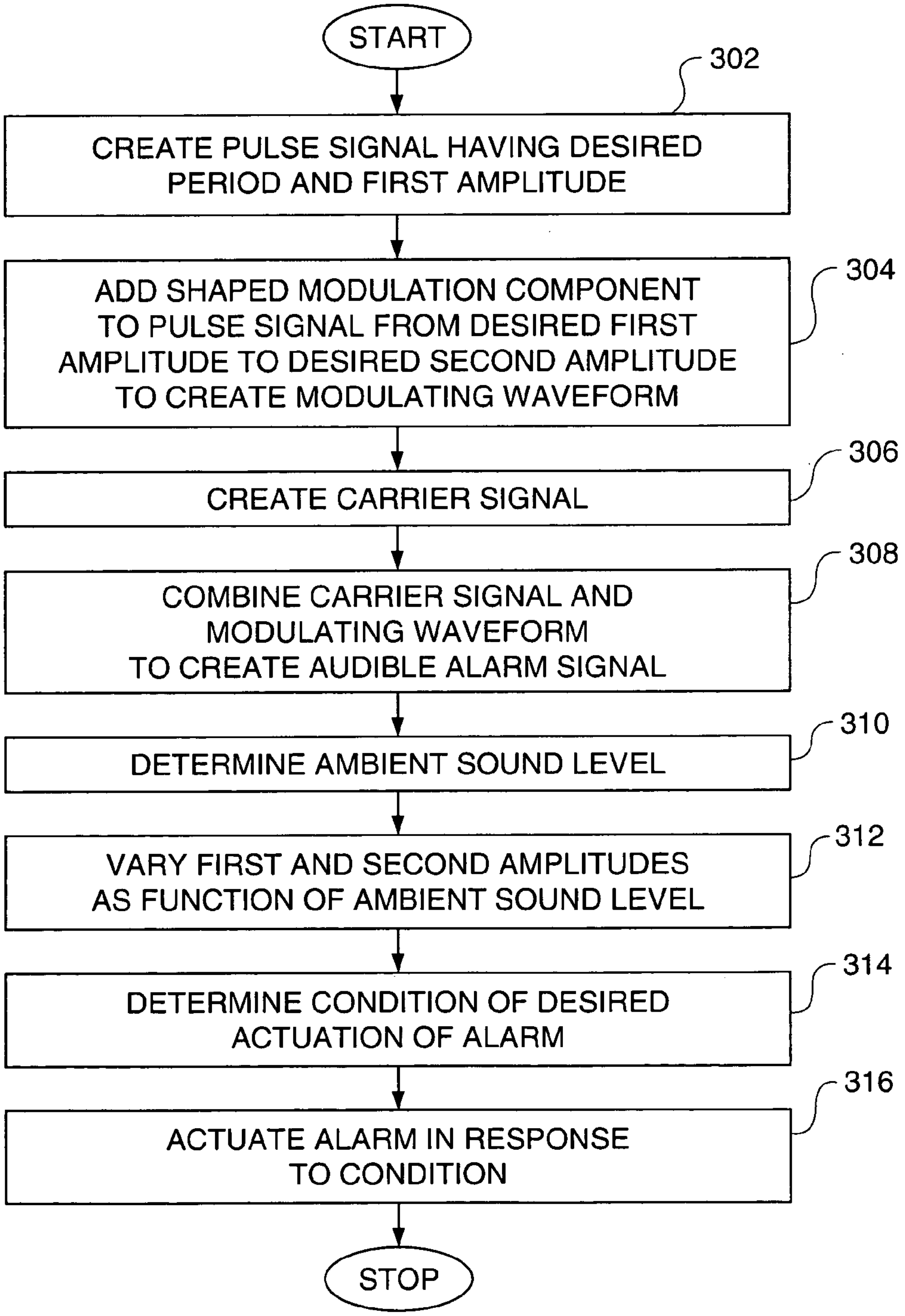
FIG. 3 is a flow diagram illustrating a method of the present invention.

FIG. 3 is a flow diagram of a method of the present invention and offers an illustration of application of the invention.

In a first control block 302, an essentially rectangular pulse signal 402 is created. The pulse signal 402 has a desired period 404, for example about 1 Hertz, and a desired first amplitude 406, for example about 90 to 100 decibels.

In a second control block 304, a shaped modulation component 408 is added to the pulse signal 402 from the desired first amplitude 406 to a desired second amplitude 410 to create a modulating waveform 412. As an example, the desired second amplitude 410 may be about 10 decibels above the desired first amplitude 406.

In a third control block 306, a carrier signal 414 is created, having a period of, for example, about 1200 to 1300 Hertz.

In a fourth control block 308, the carrier signal 414 and the modulating waveform 412 are combined to create an audible alarm signal 416, as depicted in FIG. 4*d*.

In one embodiment, an ambient sound level is determined in a fifth control block 310. Control may then proceed to a sixth control block 312, in which the first and second amplitudes 406,410 are varied as a function of the ambient sound level, thus creating a less harsh alarm sound as the distance from the alarm source increases. Alternatively, fifth and sixth control blocks 310,312 may not be used, and the first and second amplitudes 406,410 may be fixed in value.

In a seventh control block 314, a condition of a desired actuation of an alarm is determined. For example, it may be desired to actuate an alarm each time a vehicle or mobile machine is either in reverse mode or is actually moving in reverse. Other examples may include any time a vehicle or mobile machine is moving, proximity detection, intrusion alarms, fire alarms, warnings of imminent events such as blast warnings, condition alarms for medical and communications use, and the like.

In an eighth control block 316, an audible alarm is actuated in response the determined condition of seventh control block 314.

Other aspects can be obtained from a study of the drawings, the disclosure, and the appended claims.

What is claimed is:

1. A method for providing an audible alarm signal, comprising the steps of:

creating an essentially rectangular pulse signal having a desired period and a desired first amplitude;

adding a shaped modulation component to the rectangular pulse signal from the desired first amplitude to a desired second amplitude to create a modulation waveform;

creating a carrier signal; and combining the carrier signal and the modulating waveform to create the audible alarm signal.

2. A method, as set forth in claim 1, wherein adding a shaped modulation component to the rectangular pulse signal from the desired first amplitude to a desired second amplitude includes the step of adding a shaped modulation component having a desired second amplitude differing from the desired firs amplitude by a desired amplitude level.

3. A method, as set forth in claim 2, wherein adding a shaped modulation component to the rectangular pulse signal from the desired first amplitude to a desired second amplitude includes the step of adding a shaped modulation component having a desired second amplitude differing from the desired firs amplitude by a desired range of amplitude levels.

4. The method, as set forth in claim 1, wherein creating an essentially rectangular pulse signal includes the step of creating an essentially rectangular pulse signal having a predetermined time duration.

5. The method, as set forth in claim 4, wherein adding a shaped modulation component includes the step of adding a shaped modulation component having a varying amplitude during the predetermined time duration.

6. The method, as set forth in claim 5, wherein adding a shaped modulation component having a varying amplitude includes the step of adding a shaped modulation component having a continuously varying amplitude.

7. The method, as set forth in claim 1, further including the step of varying the desired first and second amplitudes of the corresponding essentially rectangular pulse signal and the shaped modulation component.

8. The method, as set forth in claim 7, wherein varying the desired first and second amplitudes includes the step of varying the desired first and second amplitudes as a function of an ambient sound level.

9. A method, as set forth in claim 1, further including the steps of:

determining an ambient sound level; and varying the desired varying the desired first and second amplitudes of the corresponding essentially rectangular pulse signal and the shaped modulation component as a function of the ambient sound level.

10. A method, as set forth in claim 1, further including the steps of:

determining a condition of desired actuation of the audible alarm signal; and actuating the audible alarm signal in response to the condition.

11. An apparatus for providing an audible alarm signal, comprising:

a controller for creating an essentially rectangular pulse signal having a desired first amplitude, and for creating a carrier signal:

a shape generator for adding a shaped modulation component to the pulse signal from the desired first amplitude to a desired second amplitude to create a modulating waveform; and a multiplier for combining the carrier signal and the modulating waveform to create the audible alarm signal.

12. An apparatus, as set forth in claim 11, further including a gain control amplifier for controlling an amplitude of the pulse signal.

13. An apparatus, as set forth in claim 11, further including an ambient sound sensor for receiving an ambient sound level and delivering the ambient sound level to the controller.

14. An apparatus, as set forth in claim 11, further including a backup sensor for determining a backup condition and delivering information relevant to the backup condition to the controller.

* * * * *

UNITED STATES PATENT AND TRADEMARK OFFICE

CERTIFICATE OF CORRECTION

PATENT NO. : 7,268,671 B2
APPLICATION NO. : 10/873875
DATED : September 11, 2007

INVENTOR(S) : Michael S. McDaniel et al.

It is certified that error appears in the above-identified patent and that said Letters Patent is hereby corrected as shown below:

In the claims:

In Column 4, Line 63, in Claim 2, delete "modulation" and insert --modulating--
(Amendments to the claims dated February 12, 2007, Page 2, Claim 1, Line 8)

In Column 4, Line 63, in Claim 2, delete "firs" and insert --first--
(Amendments to the claims dated February 12, 2007, Page 2, Claim 2, Line 4)

In Column 5, Line 2, in Claim 3, delete "firs" and insert --first--
(Amendments to the claims dated February 12, 2007, Page 2, Claim 3, Line 4)

In Column 5, Line 27, in Claim 9, delete "varying the desired" before "first and second"
(Amendments to the claims dated February 12, 2007, Page 3, Claim 9, Line 4)

Signed and Sealed this

Seventh Day of April, 2009

JOHN DOLL
*Acting Director of the United States Patent and Trademark Office*